(12) United States Patent
Sano

(10) Patent No.: US 10,726,900 B2
(45) Date of Patent: Jul. 28, 2020

(54) SEMICONDUCTOR MEMORY DEVICE AND METHOD FOR READING SEMICONDUCTOR MEMORY DEVICE

(71) Applicant: LAPIS SEMICONDUCTOR CO., LTD., Kanagawa (JP)

(72) Inventor: Seishi Sano, Kanagawa (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 0 days.

(21) Appl. No.: 15/948,849

(22) Filed: Apr. 9, 2018

(65) Prior Publication Data

US 2018/0301180 A1    Oct. 18, 2018

(30) Foreign Application Priority Data

Apr. 18, 2017  (JP) ................. 2017-082362

(51) Int. Cl.
    *G11C 11/22*  (2006.01)

(52) U.S. Cl.
    CPC ........ *G11C 11/2273* (2013.01); *G11C 11/221* (2013.01)

(58) Field of Classification Search
    None
    See application file for complete search history.

(56) References Cited

U.S. PATENT DOCUMENTS

| 5,086,412 A | * | 2/1992 | Jaffe | ........................ | G11C 11/22 327/94 |
| 6,278,630 B1 | * | 8/2001 | Yamada | .................. | G11C 11/22 365/145 |
| 2004/0057318 A1 | * | 3/2004 | Cernea | ..................... | G11C 7/06 365/226 |
| 2006/0072358 A1 | * | 4/2006 | Kang | ..................... | G11C 16/24 365/185.2 |
| 2007/0002654 A1 | * | 1/2007 | Borromeo | .............. | G11C 16/26 365/207 |
| 2019/0027202 A1 | * | 1/2019 | Bedeschi | .............. | G11C 11/221 |

FOREIGN PATENT DOCUMENTS

JP    4550094 B2    9/2010

* cited by examiner

*Primary Examiner* — Douglas King
(74) *Attorney, Agent, or Firm* — Volentine, Whitt & Francos, PLLC

(57) ABSTRACT

A semiconductor memory device includes: a first bit line; a second bit line connected to the first bit line via a first switch; a charge transfer section including: a first holding section connected to the second bit line, the first holding section being configured to hold a readout voltage from a memory section that stores data, and a second holding section connected to the first bit line, the second holding section being configured to hold a voltage generated due to transfer of charges between the first holding section and the second holding section, the charge transfer section being configured to transfer charges between the first holding section and the second holding section via the first bit line; and a comparison section configured to compare a voltage held in the second holding section with a reference voltage.

8 Claims, 8 Drawing Sheets

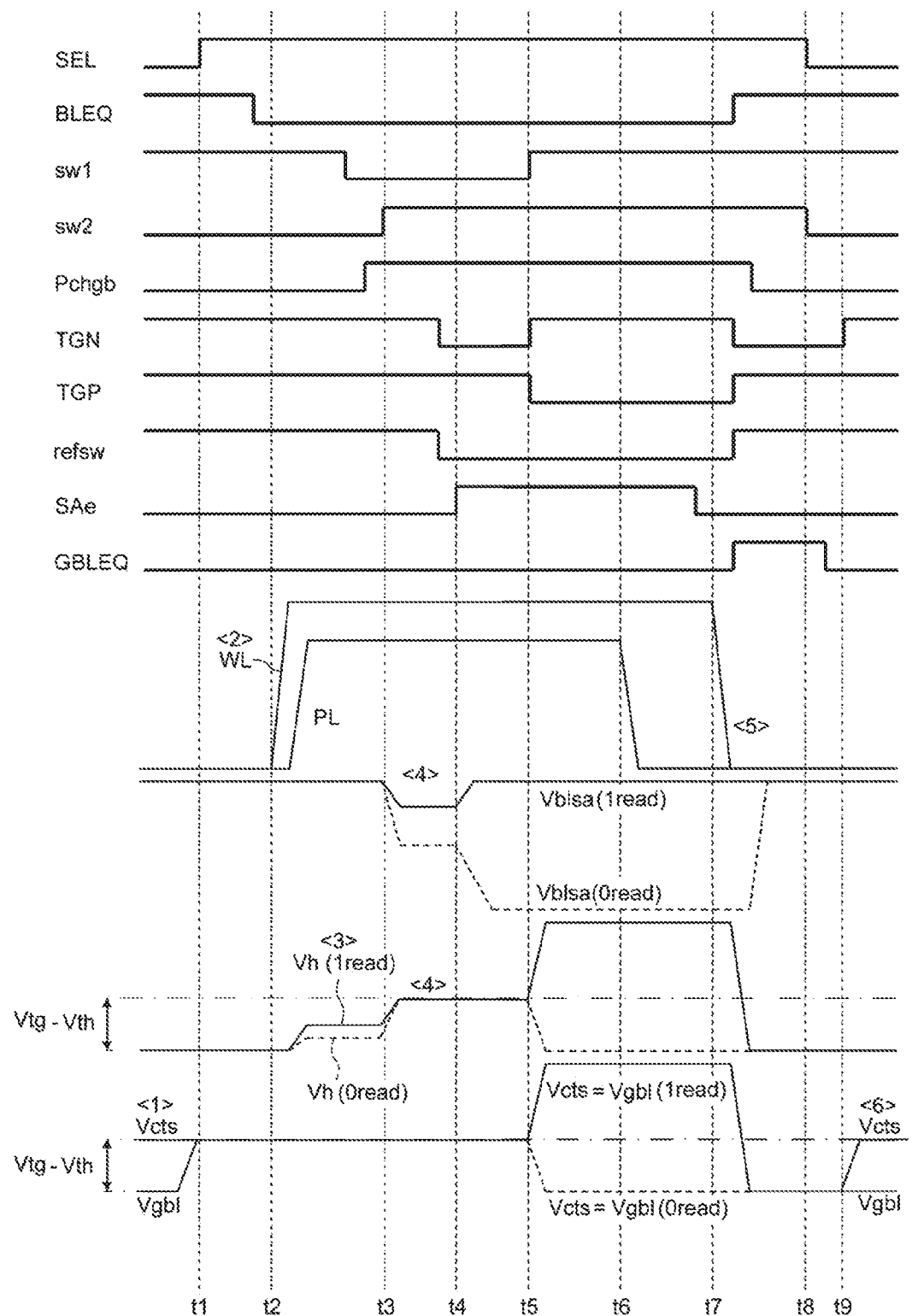

RELATED ART

SEMICONDUCTOR MEMORY DEVICE AND METHOD FOR READING SEMICONDUCTOR MEMORY DEVICE

CROSS-REFERENCE TO RELATED APPLICATION

This application claims priority under 35 USC 119 from Japanese Patent Application No. 2017-082362, filed on Apr. 18, 2017, the disclosure of which is incorporated by reference herein.

BACKGROUND

Technical Field

The present disclosure relates to a semiconductor memory device and a method for reading the semiconductor memory device according to a nonvolatile memory using a ferroelectric.

Related Art

The ferroelectric memory is a nonvolatile memory in which positive and negative residual polarization (spontaneous polarization) due to hysteresis (history effect) of a ferroelectric is made to correspond to "1" and "0" of data. As a document disclosing a ferroelectric memory, for example, Japanese Patent No. 4550094 is known. The data memory device disclosed in Japanese Patent No. 4550094 includes a memory cell connected between a plate line and a bit line as shown in FIG. 4 of Japanese Patent No. 4550094. This data memory device includes a control circuit in which when the bit line is set at the first potential and the potential of the bit line rises during a period when the potential of the plate line transitions from the first potential to the second potential, the potential of the bit line is returned to the first potential during this period. In Japanese Patent No. 4550094, according to the ferroelectric memory having such a configuration, since the charges accumulated in the memory cell can be reliably read out, a highly reliable reading out operation can be achieved.

Incidentally, in semiconductor memory devices (memories), increase in memory capacity per unit area, that is, improvement in integration degree is required. Regarding to this, reduce in size of the ferroelectric capacitor which is a memory element of the ferroelectric memory, use of low power supply voltage, are also required in the ferroelectric memory. Further, the amount of charges readout from the ferroelectric capacitor decreases in a case in which a large number of memory cells are integrated, and the readout margin in the sense amplifier connected to the memory cell becomes lowered. Namely, in a ferroelectric memory, it is required to secure a readout margin even in a small size ferroelectric capacitor, a low voltage, and a large capacity array.

Here, a readout circuit of a ferroelectric memory will be described. FIG. 1 of Japanese Patent No. 4550094 discloses a basic configuration of a ferroelectric memory (hereinafter referred to as "a first conventional ferroelectric memory"). The cell of the first conventional ferroelectric memory includes one N channel MOS transistor 14 and one ferroelectric capacitor CF. The ferroelectric capacitor CF holds 1 or 0 digital information in a nonvolatile manner by adopting a polarization state in the opposite direction.

In the first conventional ferroelectric memory, the data of the memory cell including the ferroelectric capacitor CF selected by the word line (WL) and the plate line (CP) is readout to the bit line (BL), and 0/1 information stored in the memory cell is readout by the readout bit line voltage and the reference potential (Vref) being compared by using the sense amplifier. In this case, the magnitude of the voltage Vbl (hereinafter referred to as "bit line readout voltage") readout to the bit line can be obtained from Expression (1) shown below.

$$Vbl = (1/(1+(Cbl/Cf))) \times Vpl \qquad (1)$$

Here, Cbl is a bit line parasitic capacitance (hereinafter, "bit line capacitance"), Cf is an effective capacitance of the ferroelectric capacitor CF, and Vpl is a plate line voltage.

Namely, the bit line readout voltage Vbl is determined by the voltage division with the capacitance Cf of the ferroelectric capacitor CF and the bit line capacitance Cbl. Since the capacitance Cf of the ferroelectric capacitor CF changes depending on the held data of the ferroelectric capacitor CF, a voltage corresponding to 0/1 of the held data is generated in the bit line. Thus, the ferroelectric memory is read out by comparing the bit line readout voltage Vbl with the reference potential Vref and amplifying its output by the sense amplifier.

From Expression (1), it is understood that the voltage applied to the bit line (bit line readout voltage Vbl) decreases as the plate line voltage Vpl decreases. In addition, as the size of the ferroelectric capacitor CF decreases, the capacitance Cf decreases, so that the bit line readout voltage Vbl similarly decreases. Furthermore, in a case in which the bit line capacitance Cbl increases, the bit line readout voltage Vbl also decreases. When configuring the ferroelectric memory with low voltage, small size, and large capacity, inevitably, the plate line voltage Vpl decreases, the size of the ferroelectric capacitor CF decreases, and the bit line capacitance Cbl increases. Thus, the bit line readout voltage Vbl may decrease and the readout margin in the sense amplifier may decrease.

In other words, in the first conventional ferroelectric memory, since the voltage applied to the ferroelectric capacitor CF when the plate line voltage Vpl is applied is determined by the voltage division ratio between the bit line capacitance Cbl and the capacitance Cf of the ferroelectric capacitor CF. Accordingly, in a case in which the bit line capacitance Cbl is increased and the voltage applied to the ferroelectric capacitor CF is increased, the bit line readout voltage Vbl decreases, and in a case in which the bit line capacitance Cbl is decreased and the bit line readout voltage Vbl is increased, the voltage applied to the ferroelectric capacitor CF decreases. Therefore, in order to output a large voltage also to the bit line while applying a sufficient voltage to the ferroelectric capacitor CF, a ratio between the capacitance Cf of the ferroelectric capacitor CF and the bit line capacitance Cbl needed to be optimized, and thus, there has been a restriction in design.

On the other hand, in the data memory device disclosed in the above Japanese Patent No. 4550094 (hereinafter, "a second conventional ferroelectric memory"), improvement in the read out operation is attempted on the first conventional ferroelectric memory. FIG. 6 is an equivalent circuit diagram showing only the charge transfer circuit of the second conventional ferroelectric memory. Since a large number of memory cells are connected to the bit line shown in the equivalent circuit diagram, the bit line capacitance Cbl becomes large. In a case in which the plate line CP is raised, the charges corresponding to the data is generated in the bit line, so that the voltage Vbl rises. In a case in which −Vth (gate threshold voltage) is applied to the gate of a P-channel MOS (Metal Oxide Semiconductor) transistor T2 (hereinafter, "transistor T2"), and C5 and C6 being the drain side capacitors are charged with negative voltages, the transistor T2 is turned ON when the voltage Vbl rises, and the charges generated in the bit line is transferred to C5 and C6. Thus, the bit line is maintained substantially at the GND level. In order to achieve such a configuration, a negative voltage generating circuit is required, and in the circuit in FIG. 4 of Japanese Patent No. 4550094, the negative voltage generating circuit includes transistors T4, T5, T6, and T7.

In the second conventional ferroelectric memory, since the bit line is fixed to GND, the plate line voltage Vpl is applied to the ferroelectric capacitor CF, and the amount of charges to be taken out can be increased. Namely, the second conventional ferroelectric memory improves on the first conventional ferroelectric memory.

However, since the charges from the ferroelectric capacitor CF flows toward the sense amplifier, a P-channel MOS transistor (transistor T2) is used to transfer the charges. Further, in order to connect the source of the P-channel MOS transistor to GND, a gate voltage generating circuit for a negative voltage, a drain voltage generating circuit, a switch driving circuit of the gate voltage generating circuit, and three negative voltage generating circuits are required. As a result, the circuit area may increase.

On the other hand, the P-channel MOS transistor (transistor T2) of the charge transfer circuit can be regarded as a grounded-gate amplifier circuit. The input impedance of the grounded-gate amplifier circuit can be denoted by 1/gm, in cases in which the mutual conductance of the transistor is gm. The ability to fix the bit line to GND is determined by the input impedance 1/gm, and since the gm of the P-channel MOS transistor is generally small, the input impedance becomes large. In the second conventional ferroelectric memory, in order to compensate for the low gm, amplifying by an inverter amplifier is used. However, this leads to a further increase in circuit scale and a further increase in current consumption by the inverter amplifier. Furthermore, in the circuit shown in FIG. 4 of Japanese Patent No. 4550094, since −Vth is generated by discharging the charge of C4, which has been charged upto −(VDD−Vth) to −Vth, the current consumption becomes large. As described above, the second conventional ferroelectric memory can reliably read out the charges accumulated in the memory cell; however, a negative voltage generating circuit is required, and thus, the circuit area and current consumption increases.

SUMMARY

The present disclosure provides a semiconductor memory device and a method for reading the semiconductor memory device that may have higher readout voltage margin and that may reduce an increase in circuit scale and current consumption.

A first aspect of the present disclosure is a semiconductor memory device including: a first bit line; a second bit line connected to the first bit line via a first switch; a charge transfer section including: a first holding section connected to the second bit line, the first holding section being configured to hold a readout voltage from a memory section that stores data, and a second holding section connected to the first bit line, the second holding section being configured to hold a voltage generated due to transfer of charges between the first holding section and the second holding section, the charge transfer section being configured to transfer charges between the first holding section and the second holding section via the first bit line; and a comparison section configured to compare a voltage held in the second holding section with a reference voltage.

A second aspect of the present disclosure is a method for reading a semiconductor memory device, the semiconductor memory device including: a first bit line; a second bit line connected to the first bit line via a first switch; a charge transfer section including: a first holding section connected to the second bit line, the first holding section being configured to hold a readout voltage from a memory section that stores data, and a second holding section connected to the first bit line, the second holding section being configured to hold a voltage generated due to transfer of charges between the first holding section and the second holding section, the charge transfer section being configured to transfer charges between the first holding section and the second holding section via the first bit line; and a comparison section configured to compare a voltage held in the second holding section with a reference voltage, the method including: transferring the charges by the charge transfer section while: shutting off the first switch to cause the first holding section to hold the readout voltage; and connecting the first switch to keep the potential of the first bit line constant.

According to the above aspects, the present disclosure may provide a semiconductor memory device and a method for reading the semiconductor memory device having higher readout voltage margin while reducing an increase in circuit scale and current consumption.

BRIEF DESCRIPTION OF THE DRAWINGS

Exemplary embodiments will be described in detail based on the following figures, wherein:

FIG. 3 is a timing chart showing an action of a memory cell of the semiconductor memory device according to the first exemplary embodiment;

DETAILED DESCRIPTION

In the following, detailed description of the present disclosure will be described in detail with reference to the drawings.

First Exemplary Embodiment

Figure 1:
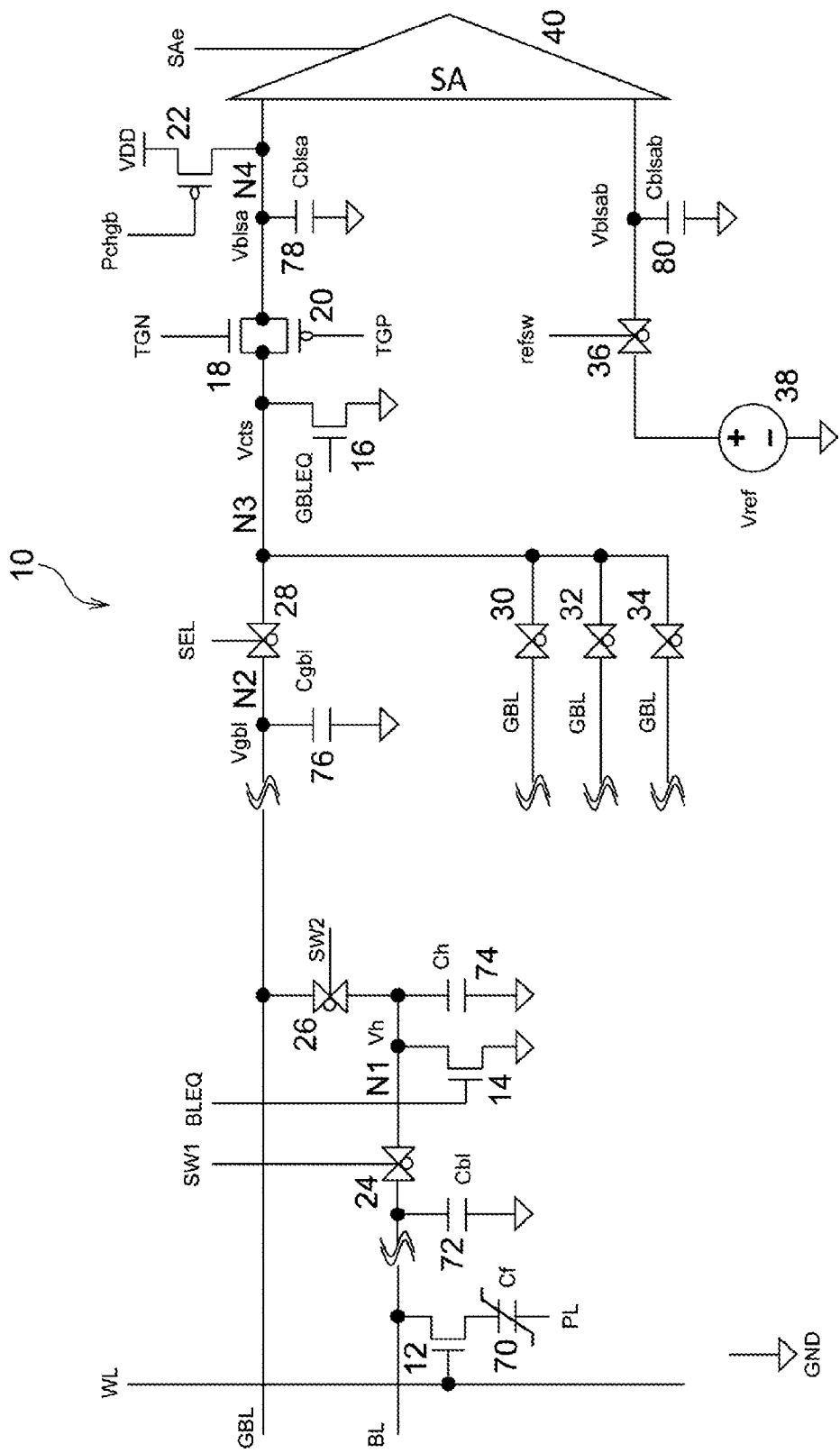
FIG. 1 is a circuit diagram showing an example configuration of a semiconductor memory device according to a first exemplary embodiment.

With reference to FIGS. 1 to 3, a semiconductor memory device and a method for reading the semiconductor memory device according to the present exemplary embodiment will be described. As shown in FIG. 1, the semiconductor memory device 10 according to the present exemplary embodiment includes a ferroelectric capacitor 70 (capacitance C0, N-channel MOS-FETs (Field Effect Transistor. hereinafter, "transistors") 12, 14, 16, and 18, P-channel MOS-FETs (hereinafter, "transistors") 20 and 22, switches 24, 26, 28, and 36, capacitors 72 (capacitance Cbl), 74 (capacitance Ch), 76 (capacitance Cgbl), 78 (capacitance Cblsa), and 80 (capacitance Cblsab), a reference power supply 38, and a sense amplifier 40. Plural memory cells are connected with each of the wiring lines of a global bit line GBL, a local bit line BL, a word line WL, and a plate line PL.

Each of the switches 30, 32, and 34 shown in FIG. 1 is a switch corresponding to the switch 28. Other memory blocks (not shown) sharing a sense amplifier with these switches are connected, and thus, a memory cell array is configured. Each of the switches 24, 26, 28, 30, 32, 34, and 36 is a CMOS switch, and is turned ON when the switching signal is at a high level (hereinafter referred to as "H") and turned OFF when the switching signal is at a low level (hereinafter referred to as "L"). Here, the capacitor 76 equivalently represents the parasitic capacitance Cgbl of the global bit line GBL and the capacitor 72 equivalently represents the parasitic capacitance Cbl of the local bit line BL.

The global bit line GBL is arranged so as to cross the entire memory array. The local bit line BL is obtained by dividing the global bit line GBL into plural lines, and runs parallel to the global bit line GBL. A large number of ferroelectric capacitors 70 and transistors 12 being selection transistors are connected to the local bit line BL (not shown). The local bit line BL and the global bit line GBL are cut off by the switch 24 and the switch 26, and a transistor 14 for discharging the local bit line BL and a charge holding capacitor 74 (capacitance Ch) are connected between the switch 24 and the switch 26. Hereinafter, a combination of the ferroelectric capacitor 70 and the transistor 12 may be referred to as a "memory cell".

Plural global bit lines GBL are connected to the node N3 (source of the transistor 18, potential Vcts) through switches 28, 30, 32, and 34 switched with a SEL signal. Here, in the present exemplary embodiment, the logic level H is the potential VDD (power supply potential), and L is the GND (ground) potential (ground potential), unless otherwise specified.

The switches 24 and 26 and the capacitor 74 configure a sample-and-hold circuit. The voltage readout from the memory cell is temporarily held in the capacitor 74 in a state in which the switch 24 is turned ON and the switch 26 is turned OFF. In addition, when the switch 24 is turned OFF and the switch 26 is turned ON, the capacitor 74 and the capacitor 76 are connected, charges moves from the capacitor 76 toward the capacitor 74, and the potential Vgbl (global bit line potential) of the node N2 drops.

The transistors 18 and 20 configure a transistor pair whose gates are respectively driven by the TGN signal and the TGP signal, and the transistor 18 configure a charge transfer path. As the TGN signal, a signal having H at the potential Vtg and L at the GND level is input. As the TGP signal, a signal having H at the VDD level and L at the GND level is input. In a case in which the Pchgb signal being the gate signal of the transistor 22 is set to L while maintaining the TGN signal at H (potential Vtg), the potential Vblsa (sense amplifier input potential) of the node N4 is pre-charged to the VDD level, and the potential Vgbl of the node N2 is pre-charged to Vtg−Vth.

On the other hand, in a case in which the potential Vgbl being the source potential of the transistor 18 decreases while the Pchgb signal set to H, the transistor 18 is turned ON to transfer the charges of the capacitor 78 to the node N2, and operates to keep the potential of the node N2 at a constant potential of Vtg−Vth. As a result, since the potential Vgbl of the node N2 is kept constant, charging and discharging of the capacitor 76 does not occur, and charges are transferred from the capacitor 78 toward the capacitor 74. The difference between the potential Vblsa of the node N4 at this time and the potential Vref of the reference power supply 38 (reference potential of the sense amplifier) is compared and amplified by the sense amplifier 40, whereby the data of the memory cell is readout. The above is an outline of the readout operation of the semiconductor memory device 10, which will be described in more detail below with reference to FIGS. 2A to 2C and 3.

Figure 2A:
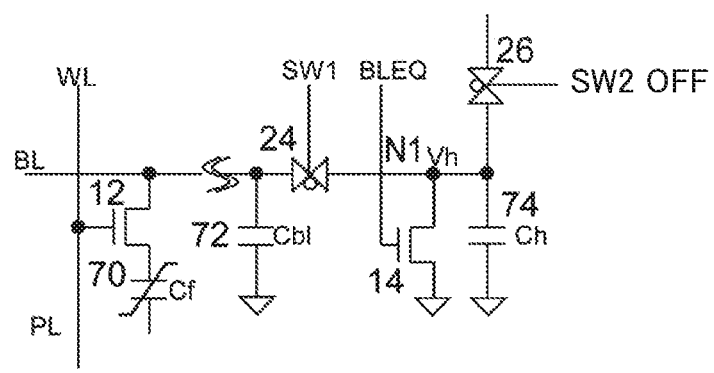
FIG. 2A is a circuit diagram for illustrating a sample-and-hold action of the semiconductor memory device according to the first exemplary embodiment.

With reference to FIG. 2A, a sample-and-hold action in a readout operation of the semiconductor memory device 10 will be described. First, the local bit line BL and the global bit line GBL are disconnected by the switch 26 being turned OFF by the switching signal SW2. In an initial state, the switch 24 is turned ON by the switching signal SW1, H is input as the BLEQ signal being the gate input signal of the transistor 14, and the potential of the local bit line BL reaches the GND level. When the word line WL and the plate line PL in the memory array are selected after the BLEQ signal is set to L, data is readout from the corresponding ferroelectric capacitor 70. At this time, since the local bit line BL is disconnected from the global bit line GBL by the switch 26, the capacitance Cbl of the capacitor 72 becomes the local bit line capacitance Cbl of only the short local bit line BL. Therefore, a larger bit line potential can be obtained as compared with the case of the reading out using in the longer global bit line GBL. In a case in which the switch 24 is turned OFF by the switching signal SW1, the potential readout to the local bit line BL is held in the capacitor 74. Note that, hold potential is denoted as Vh.

Figure 2B:
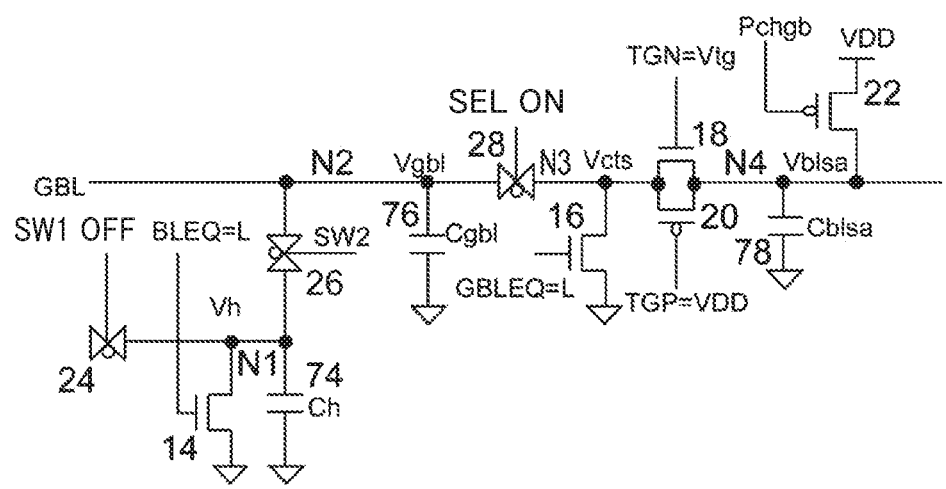
FIG. 2B is a circuit diagram for illustrating a charge transfer action of the semiconductor memory device according to the first exemplary embodiment.

Next, with reference to FIG. 2B, the charge transfer action in the readout operation of the semiconductor memory device 10 will be described. By the setting of Pchgb=L, TGP=VDD, and GBLEQ=L in the initial state, the potential Vblsa of the node N4 is pre-charged to Vblsa=VDD, and the potential Vcts of the node N3 is pre-charged to Vcts=Vtg−Vth. The switch 28 is turned ON by the SEL signal, that corresponds to the global bit line GBL for readout determined by an address signal from the outside, so that the potential Vgbl of the node N2 is pre-charged to Vgbl=Vcts=Vtg−Vth.

After the above sample-and-hold action, when the switch 24 is turned OFF and the switch 26 is turned ON, charge transfer occurs due to the potential difference between the potential Vh and the potential Vcts, and by setting Vtg so that Vh<Vcts=Vgbl, the potential Vcts=Vgbl decreases, due to the movement of charges from the capacitor 76 toward the capacitor 74. Since the source potential of the transistor 18 is Vcts, when the potential Vcts decreases, the potential difference between the gate and the source increases, the transistor 18 is turned ON, charges are supplied from the capacitor 78, and the potential Vcts=Vgbl rises. When the potential Vcts rises to Vcts=Vgbl=Vtg−Vth again, the transistor 18 is turned OFF, and the supply of charges from the capacitor 78 is also stopped.

Since the potential Vcts=Vgbl is kept constant by the negative feedback operation as described above, charges are transferred from the capacitor 78 to the capacitor 74 without being affected by the capacitance Cgbl of the capacitor 76 parasitic on the global bit line GBL. Since the charges to be transferred are Ch·(Vcts−Vh), the potential Vblsa expressed by the following Expression (2) is generated at the node N4.

$$Vblsa = VDD - Ch \cdot (Vcts - Vh)/Cblsa \quad (2)$$

As shown in Expression (2), the potential Vh generated at the node N1 can be transmitted to the potential Vblsa of the node N4 without being affected by the capacitor 76 (capacitance Cgbl) being the parasitic capacitance of the global bit line.

Figure 2C:
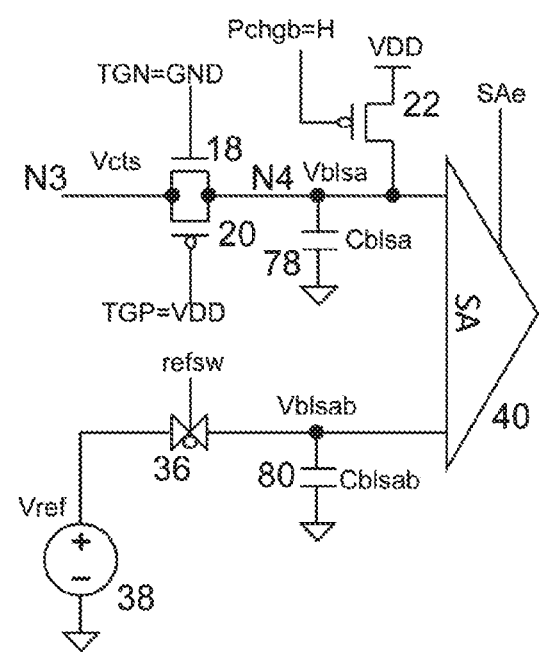
FIG. 2C is a circuit diagram for illustrating an amplifying action of a sense amplifier of the semiconductor memory device according to the first exemplary embodiment.

Next, with reference to FIG. 2C, the sense amplifier amplifying action in the readout operation of the semiconductor memory device 10 will be described. In the initial state, the switch 36 is turned ON by the refsw signal to make the potential Vblsab (sense amplifier input potential)=Vref, and then the switch 36 is turned OFF by the refsw signal to hold the Vref potential in the capacitor 80 (capacitance Cblsab) as the potential Vblsab. On the other hand, after reading out the hold potential Vh of the memory cell as the potential Vblsa with the charge transfer action, the hold potential Vh is held in the capacitor 78 (capacitance Cblsa) as TGN=GND. Next, the SAe signal (sense amplifier activation signal) is set to H to operate the sense amplifier 40, and the potential Vblsa and the potential Vblsab are compared and the potential difference therebetween is amplified, whereby the data of the memory cell is readout at the logic signal level.

Next, with reference to FIG. 3, the readout operation of semiconductor memory device 10 will be described from the viewpoint of the timing of each signal. Each of the waveforms of the signals SEL, BLEQ, SW1, SW2, Pchgb, TGN, TGP, refsw, SAe, and GBLEQ shown in FIG. 3 shows the waveform of a corresponding one of the signals shown in FIG. 1. The logical values of each of the signals shown in FIG. 3 are H=VDD and L=GND except for TGN, and H=Vtg and L=GND for TGN. It should be noted that the symbol <X> shown below represents the position indicated by the same symbol in FIG. 3.

At time t1, SEL=H is set and the global bit line GBL is selected. At this time, the node N2 is pre-charged to the potential Vgbl=Vtg−Vth (<1>).

BLEQ=L is set between times t1 and t2, and the discharge of the local bit line BL is ended.

At time t2, the word line WL and the plate line PL are selected (<2>), and the data of the memory cell is readout to the node N1 (the potential of the node N1 is Vh).

Between times t2 and t3, the SW1 signal is set to L, and the potential Vh (hold potential) of the node N1 is held (<3>). The Pchgb signal is set to H, and pre-charging is ended.

At time t3, the SW2 signal is set to H, and the charges of the capacitor 78 (capacitance Cblsa) are transferred to the capacitor 74 (capacitance Ch) (<4>).

Between times t3 and t4, the TGN signal is set to L and the refsw signal is set to L, and the global bit line GBL and the reference power supply 38 (potential Vref) are disconnected from the input of the sense amplifier 40.

At time t4, the SAe signal is set to H to activate the sense amplifier 40 to amplify the potential difference between the potential Vblsa of the node N4 and the reference potential Vref.

At time t5, the TGN signal is set to H, the TGP signal is set to L, and the signal amplified by the sense amplifier 40 is input to the global bit line GBL.

Between times t5 and t6, data "0" is rewritten into the cell from which data "0" is readout.

At time t6, the potential of the plate line PL is fixed to GND.

Between times t6 and t7, data "1" is rewritten into the cell from which data "1" is readout.

Between time t7 and t8, the word line WL is caused to fall (<5>). The TGN signal is set to L, and the TGP signal is set to H, so that the input of the sense amplifier 40 and the global bit line GBL are disconnected, and the GBLEQ signal is set to H, so that the global bit line GBL is discharged. In addition, the Pchgb signal is set to L to precharge the potential Vblsa of the node N4 to VDD.

At time t8, the SEL signal is set to L to disconnect the global bit line GBL from the node N3 (potential Vcts).

Between times t8 and t9, the GBLEQ signal is set to L, and the discharge of the global bit line GBL is ended.

At time t9, the TGN signal is set to H, and the node N3 is pre-charged to the potential (Vtg−Vth) (<6>).

As described in detail above, according to a semiconductor memory device and a method for reading the semiconductor memory device according to the present exemplary embodiment, the following function may be achieved.

(1) The parasitic capacitance Cbl of the bit line BL may be reduced. Namely, in view of the range of the sample-and-hold circuit shown in FIG. 2A from the memory cell, although the readout operation of the ferroelectric memory according to the present exemplary embodiment is not different from the readout operation of the first conventional ferroelectric memory, since the global bit line GBL is divided into a short local bit line BL, the bit line parasitic capacitance Cbl is decreased, and the voltage generated in the bit line BL can be increased.

(2) Even in a case in which the global bit line GBL is lengthened, the readout margin does not change. Namely, since the potential Vblsa generated at the node N4 is given by (Expression 2), the ferroelectric memory may be readout with the sense amplifier 40 without being affected by the parasitic capacitance Cgbl of the global bit line GBL.

(3) The circuit area may be reduced. Namely, since each circuit of the semiconductor memory device according to the present exemplary embodiment is a circuit operating within a voltage range of a logic level (range from GND to VDD), a large circuit area for generating a negative voltage as in the second conventional ferroelectric memory is not needed. Therefore, the same function as in the second conventional ferroelectric memory may be achieved while increase in the circuit area may be prevented.

(4) The occurrence of coupling noise between bit lines may be prevented. Namely, in the first conventional ferroelectric memory, since the data of the memory cell is transmitted to the sense amplifier and the voltage of the bit line is changed, readout margin may deteriorate and the data may garble due to the coupling noise between adjacent bit lines. On the other hand, in the semiconductor memory device according to the present exemplary embodiment, since the system transmits the potential of the global bit line GBL without any change, the occurrence of the coupling noise may be prevented.

The readout margin may be increased by the above functions (1), (2), and (4). As a result, decrease in voltage, decrease in area, and increase in capacity of the ferroelectric memory array may be achieved. In addition, due to the effect of (3), decrease in voltage, decrease in area, and increase in capacity of the ferroelectric memory array may be achieved with a smaller area circuit.

Second Exemplary Embodiment

With reference to FIGS. 4 and 5A to 5D, a semiconductor memory device and a method for reading the semiconductor memory device according to the present exemplary embodiment will be described. The present exemplary embodiment is a mode in which a setting circuit of the TGN signal (hereinafter referred to as "TGN setting circuit") in the circuit of the semiconductor memory device 10 shown in FIG. 1 is added and the readout margin is further increased. Accordingly, since the circuit diagram of the semiconductor memory device 10 shown in FIG. 1 and the timing chart shown in FIG. 3 are common, when necessary, refer to FIG. 1 and FIG. 3 and illustration thereof is omitted.

Figure 4:
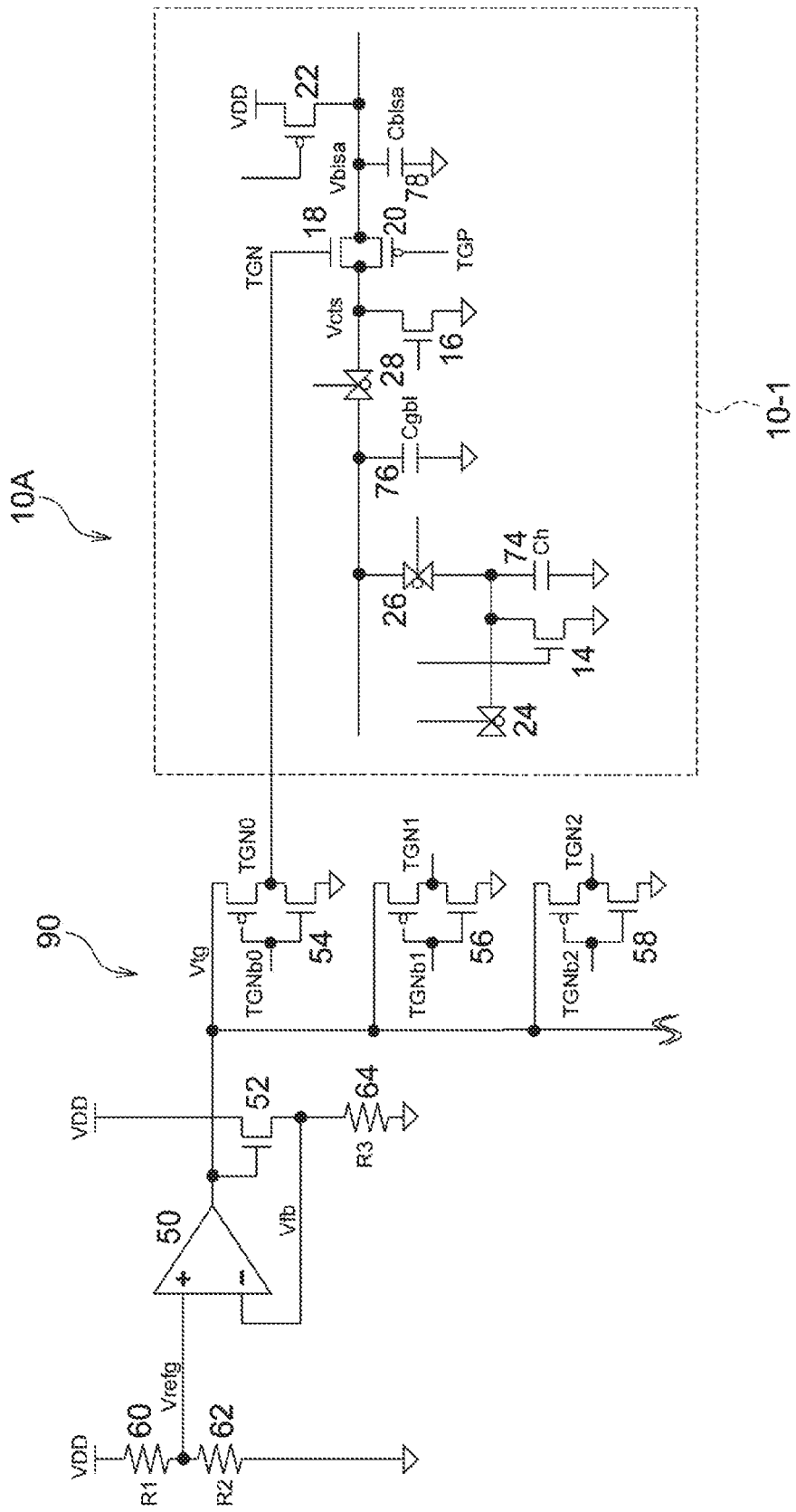
FIG. 4 is a circuit diagram showing an example configuration of a semiconductor memory device according to a second exemplary embodiment.

As shown in FIG. 4, the semiconductor memory device 10A according to the present exemplary embodiment includes a TGN setting circuit 90 and plural semiconductor memory devices 10 connected to the TGN setting circuit 90 (only the semiconductor memory device 10-1 being the same circuit as the semiconductor memory device 10 is shown in FIG. 4). The TGN setting circuit 90 includes an operational amplifier 50, a transistor 52, gate circuits 54, 56, and 58, resistors 60 (resistance value R1), 62 (resistance value R2), and 64 (resistance value R3). The output terminals TGN0, TGN1, and TGN2 of the respective gate circuits 54, 56, and 58 are respectively connected to the gates of the transistors 18 of the semiconductor memory devices 10-1, 10-2 (not shown), and 10-3 (not shown), and supply TGN signals. In FIG. 4, although a case in which three semiconductor memory devices 10 are connected via gate circuits is illustrated, the number of the semiconductor memory devices 10 connected via the gate circuits is not limited thereto. As many connections as needed may be made according to the memory capacity or the like of the semiconductor memory device 10A.

TGNb0, TGNb1, and TGNb2 shown in FIG. 4 are respectively input signals to the gate circuits 54, 56, and 58. The TGN signal of the semiconductor memory device 10 is controlled according to the logic of TGNb0, TGNb1, and TGNb2. For example, when TGNb0 is set to L, the Vtg potential is supplied as the TGN signal of the 0th semiconductor memory device 10-1, and when TGNb0 is set to H, the TGN signal of the 0th semiconductor memory device 10-1 is fixed to the GND level.

On the other hand, as shown in FIG. 4, the potential Vrefg generated by dividing the power supply VDD with the resistors 60 and 62 is input into the non-inverting terminal of the operational amplifier 50. At this time, due to the negative feedback operation of the operational amplifier 50, the potential Vrefg set by the ratio of the resistance values R1 and R2 and the potential Vfb input into the inverting terminal become substantially equal. When the current flowing through the transistor 52 is limited by the resistor 64 (resistance value R3), the potential Vfb becomes substantially equal to (Vtg−Vth), so that $$Vrefg=Vtg-Vth$$

that is, $$Vtg=Vrefg+Vth$$

holds true. At this time, when the transistor 18 matches the transistor 52 (when the characteristics are substantially the same), $$Vcts=Vtg-Vth=Vrefg+Vth-Vth=Vrefg$$

is obtained, and a potential equal to the potential Vrefg set by the resistance voltage division ratio of the resistance values R1 and R2 is generated in Vcts.

Figure 5A:
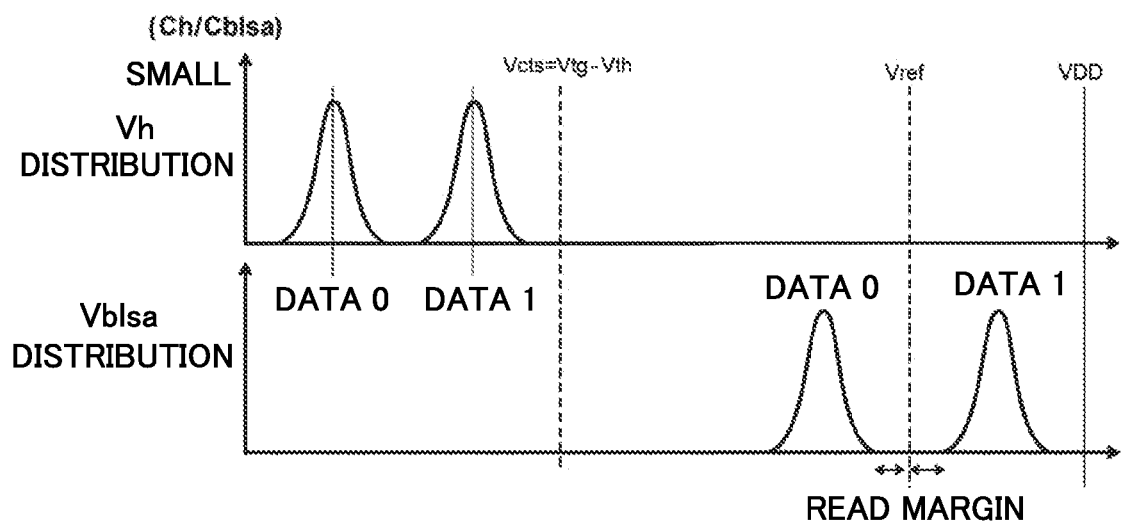
FIGS. 5A to 5D are diagrams showing actions of the semiconductor memory device according to the second exemplary embodiment.
Figure 5B:
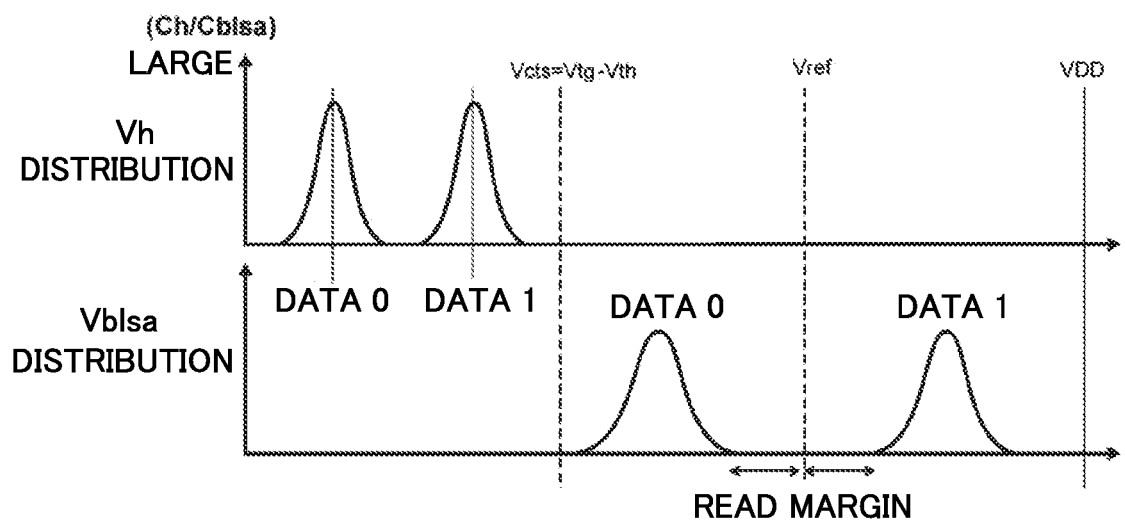
Figure 5C:
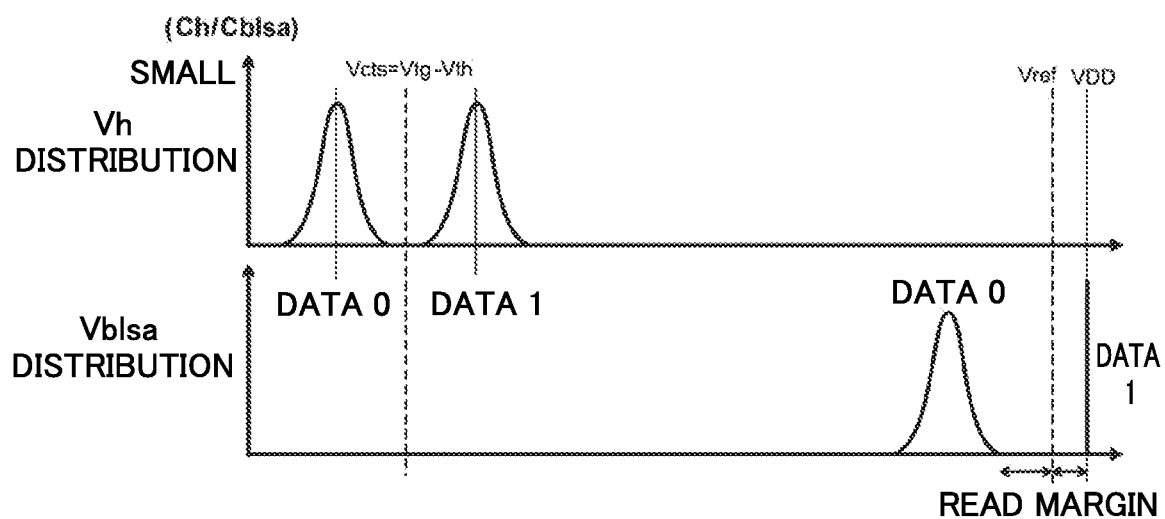
Figure 5D:
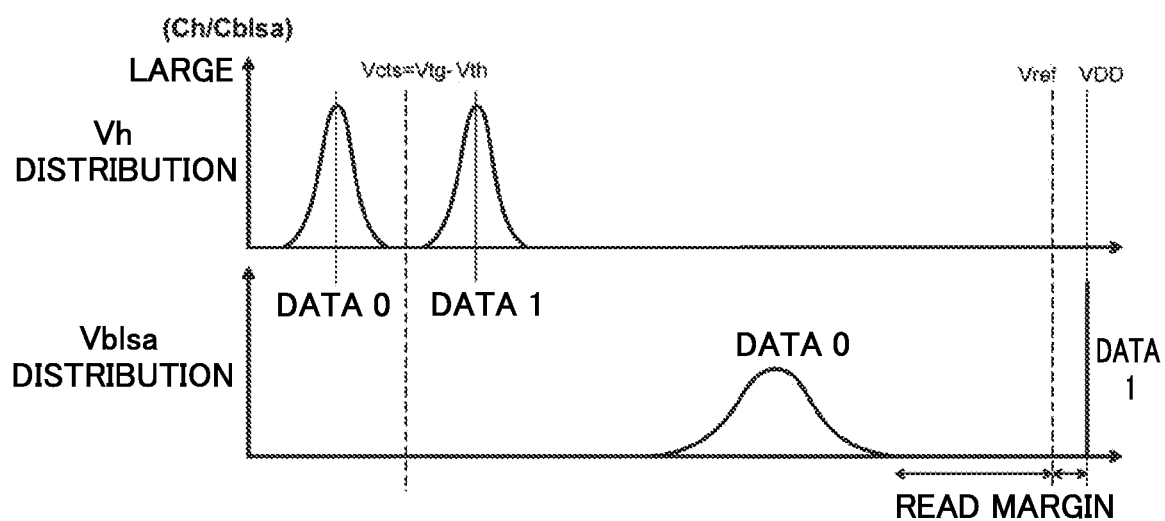
Figure 6:
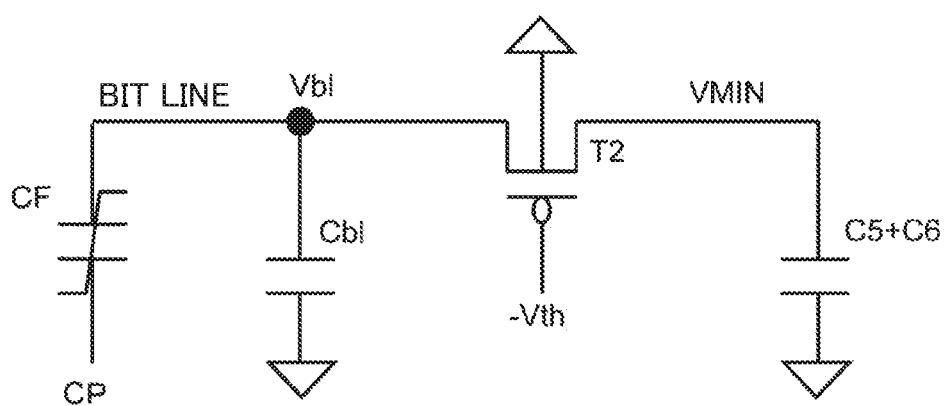
FIG. 6 is an equivalent circuit diagram of a charge transfer circuit of a conventional ferroelectric memory.

With reference to FIGS. 5A to 5D, readout margin of the semiconductor memory device 10A according to the present exemplary embodiment will be described. FIGS. 5A and 5B show the distribution of the potential Vh during sample-and-hold and the distribution of the potential Vblsa during charge transfer of the semiconductor memory device 10 according to the above exemplary embodiment, and FIGS. 5C and 5D show the distribution of the potential Vh during sample-and-hold and the distribution of the potential Vblsa during charge transfer of the semiconductor memory device 10A according to the present exemplary embodiment.

As shown in FIG. 5A, in the semiconductor memory device 10, the potential Vtg is set so that Vcts=Vtg−Vth is higher than the distribution of the potential Vh during reading out data "1". Since Expression (2) holds true, data "0" having a large potential difference between the potential Vcts and the potential Vh is distributed on the low potential side in the distribution of Vblsa. Here, in a case in which it is attempted to increase the ratio (Ch/Cblsa) as shown in FIG. 5B in order to improve the readout margin, the potential Vref needs to be shifted to the low potential side. In other words, since the potential Vref depends on the ratio (Ch/Cblsa), in a case in which the value of the ratio (Ch/Cblsa) is inaccurate, any one of the data "0" and "1" in the Vblsa distribution approaches the potential Vref, and thus, the readout margin decreases.

In order to solve the above problem, as shown in FIG. 5C, in the present exemplary embodiment, the potential Vtg is set such that the potential Vcts=Vtg−Vth is positioned between data "0" and "1" in the Vh distribution. In a case in which the potential Vtg is set in this way, the Vh distribution of the data "1" becomes higher than Vcts, so that the charge transfer action shown in FIG. 2B does not occur, and the potential Vblsa during reading out data "1" is fixed to VDD. On the other hand, at the data "0" side, a potential proportional to the potential difference from the Vcts and the ratio (Ch/Cblsa) is generated in Vblsa. Here, in a case in which the potential Vref is set to a constant potential lower than VDD, the difference between the potential Vref and the Vblsa distribution of data "1" is constant even in a case in which the ratio (Ch/Cblsa) is changed, and a stable readout margin may be obtained. Thus, in a case in which the ratio (Ch/Cblsa) is set large to a certain degree, the potential difference between the Vblsa distribution of the data "0" and the potential Vref may be increased, and thus, the readout margin may be increased.

As described in detail above, according to a semiconductor memory device and a method for reading the semiconductor memory device according to the present exemplary embodiment, the following function may be produced.

(1) Adjustment in the potential of the reference potential Vref may not be necessary. In the present exemplary embodiment, since it is only needed to secure the potential difference (VDD−Vref) that the sense amplifier can amplify, for example, a potential generation circuit for (VDD−Vth) or the like is only needed. Thus, the present exemplary embodiment does not need to include a highly accurate Vref generating circuit.

(2) The readout margin may be increased. Namely, since the potential adjustment of the potential Vref is unnecessary, even in a case in which the ratio (Ch/Cblsa) is increased, the ratio (Ch/Cblsa) may be easily increased. Since the readout margin may be increased by the ratio (Ch/Cblsa) being increased, even in a case in which the offset of the sense amplifier 40 is large, accurate reading out may be performed. The potential difference between the Vh distribution and Vcts changes depending on the accuracy of the potential Vcts, and as a result, the readout margin changes. However, since the readout margin is amplified, the error of Vcts to a certain extent does not affect the reading out by the sense amplifier 40.

What is claimed is:

1. A semiconductor memory device comprising:
    a first bit line;
    a second bit line connected to the first bit line via a first switch;
    a charge transfer section comprising
        a first holding section connected to the second bit line, the first holding section being configured to hold a readout voltage from a memory section that stores data,
        a second holding section connected to the first bit line, the second holding section being configured to hold a voltage generated due to transfer of charges between the first holding section and the second holding section,
        a second switch provided on the second bit line between the memory section and the first holding section, and
        a third holding section provided on the second bit line between the memory section and the second switch,
        the charge transfer section being configured to transfer charges between the first holding section and the second holding section via the first bit line; and
    a comparison section configured to compare a voltage held in the second holding section with a reference voltage.

2. The semiconductor memory device according to claim 1, wherein the charge transfer section shuts off the first switch and causes the first holding section to hold the readout voltage.

3. The semiconductor memory device according to claim 1, wherein the charge transfer section comprises a potential control section configured to keep a potential of the first bit line constant when the charges are transferred.

4. The semiconductor memory device according to claim 3, wherein
    the charge transfer section comprises a third switch provided between the first holding section and the second holding section, and
    the charge transfer section shuts off the third switch before the charges are transferred to charge the second holding section to a predetermined voltage so that charges are transferred from the second holding section to the first holding section.

5. The semiconductor memory device according to claim 4, wherein
    the third switch comprises a field effect transistor having a predetermined threshold value, and
    the potential control section keeps a potential of the first bit line at a target potential obtained by subtracting the predetermined threshold value from a gate potential of the field effect transistor when the charges are transferred.

6. The semiconductor memory device according to claim 5, further comprising a setting section configured to set the gate potential, the setting section setting the gate potential so that the target potential is positioned between a distribution of the readout voltage in a case in which the data is 0 and a distribution of the readout voltage in a case in which the data is 1.

7. The semiconductor memory device according to claim 1, wherein the memory section comprises a ferroelectric capacitor.

8. A method for reading a semiconductor memory device, the semiconductor memory device comprising a first bit line; a second bit line connected to the first bit line via a first switch; a charge transfer section comprising a first holding section connected to the second bit line, the first holding section being configured to hold a readout voltage from a memory section that stores data, a second holding section connected to the first bit line, the second holding section being configured to hold a voltage generated due to transfer of charges between the first holding section and the second holding section, a second switch provided on the second bit line between the memory section and the first holding section, and a third holding section provided on the second bit line between the memory section and the second switch, the charge transfer section being configured to transfer charges between the first holding section and the second holding section via the first bit line; and a comparison section configured to compare a voltage held in the second holding section with a reference voltage, the method comprising:
    transferring the charges by the charge transfer section while
        shutting off the first switch to cause the first holding section to hold the readout voltage; and
        connecting the first switch to keep the potential of the first bit line constant.

* * * * *